United States Patent
Yu et al.

(10) Patent No.: US 12,148,790 B2
(45) Date of Patent: Nov. 19, 2024

(54) CAPACITOR STRUCTURE AND MANUFACTURING METHOD THEREOF, AND MEMORY

(71) Applicant: CHANGXIN MEMORY TECHNOLOGIES, INC., Hefei (CN)

(72) Inventors: Yin Kuei Yu, Hefei (CN); Haihan Hung, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 327 days.

(21) Appl. No.: 17/456,808

(22) Filed: Nov. 29, 2021

(65) Prior Publication Data
US 2022/0085146 A1    Mar. 17, 2022

Related U.S. Application Data

(63) Continuation of application No. PCT/CN2021/096054, filed on May 26, 2021.

(30) Foreign Application Priority Data

Jun. 4, 2020 (CN) .......................... 202010497954.3

(51) Int. Cl.
H01L 21/00 (2006.01)
H01L 49/02 (2006.01)
H10B 12/00 (2023.01)

(52) U.S. Cl.
CPC ........... *H01L 28/60* (2013.01); *H10B 12/033* (2023.02)

(58) Field of Classification Search
CPC .............................. H01L 28/60; H10B 12/033
See application file for complete search history.

(56) References Cited

U.S. PATENT DOCUMENTS 6,207,494 B1    3/2001  Graimann et al.
2013/0250477 A1  9/2013  Lim
(Continued)

FOREIGN PATENT DOCUMENTS

CN        1279509 A     1/2001
CN      101752379 A     6/2010
(Continued)

OTHER PUBLICATIONS

Written Opinion cited in PCT/CN2021/096054, mailed on Aug. 17, 2021, 6 pages.
(Continued)

*Primary Examiner* — Richard A Booth
(74) *Attorney, Agent, or Firm* — Kilpatrick Townsend & Stockton LLP

(57) ABSTRACT

The present application relates to a capacitor device and a manufacturing method thereof, and a memory. forming a first capacitor structure on a substrate, includes: a first capacitor dielectric layer, a first upper electrode, a plurality of first lower electrodes arranged at intervals; the first capacitor dielectric layer at least covers sidewalls of the first lower electrodes, and the first upper electrode fills up gaps at an outer side of the first capacitor dielectric layer; forming a second capacitor structure on the first capacitor structure, the second capacitor structure includes a second capacitor dielectric layer, a second upper electrode, and a plurality of second lower electrodes arranged at intervals; the second lower electrodes are of a U-shaped structure, bottoms of the second lower electrodes are in contact with tops of the first lower electrodes, the second capacitor dielectric layer is at least located on surfaces of the second lower electrodes.

18 Claims, 10 Drawing Sheets

(56) References Cited

U.S. PATENT DOCUMENTS

2014/0312460 A1   10/2014  Lee
2015/0221718 A1*  8/2015  Rhie .................... H10B 12/318
                                                                         438/386

FOREIGN PATENT DOCUMENTS

CN       110504283 A    11/2019
TW         I520191 B     2/2016
WO    2015117222 A1    8/2015

OTHER PUBLICATIONS

International Search Report as cited in PCT Application No. PCT/CN2021/096054 mailed Aug. 17, 2021, 8 pages.

* cited by examiner

CAPACITOR STRUCTURE AND MANUFACTURING METHOD THEREOF, AND MEMORY

CROSS-REFERENCE TO RELATED APPLICATIONS

This application is a continuation of International Patent Application No. PCT/CN2021/096054, filed on May, 26, 2021, which claims priority to Chinese Patent Application No. 202010497954.3, entitled "CAPACITOR STRUCTURE AND MANUFACTURING METHOD THEREOF, AND MEMORY" and filed with the China National Intellectual Property Administration on Jun. 4, 2020. International Patent Application No. PCT/CN2021/096054 and Chinese Patent Application No. 202010497954.3 are incorporated herein by reference in their entireties.

TECHNICAL FIELD

The present application relates to the field of semiconductor memory device technologies, and in particular to a capacitor structure and a manufacturing method thereof, and a memory.

BACKGROUND

With a reduction in the size of semiconductor memory devices, it is increasingly difficult to achieve an identical or larger capacitance. According to capacitance formulae, if an increase in capacitance is desired when the same dielectric material with a high dielectric constant is used, the only way is to increase the surface area and/or decreasing the thickness of a dielectric material layer. However, decreasing the thickness of the dielectric material layer might cause excessive leakage current.

Therefore, in order to meet the structural requirements of a memory capacitor, it is typically necessary, for the structural design of the capacitor, to etch a very deep channel on a substrate and to evenly plate upper and lower electrode plates and a dielectric film with a high dielectric constant onto the surface of the substrate. This imposes certain limitations on etching and film plating capabilities.

SUMMARY

According to various embodiments, provided are a capacitor device and a manufacturing method thereof, and a memory.

A manufacturing method of a capacitor device includes:
providing a substrate;
forming a first capacitor structure on the substrate, the first capacitor structure including: a first capacitor dielectric layer, a first upper electrode, and a plurality of first lower electrodes arranged at intervals; wherein the first lower electrodes are of a columnar structure, the first capacitor dielectric layer at least covers sidewalls of the first lower electrodes, and the first upper electrode is located on a surface of the first capacitor dielectric layer and fills up gaps at an outer side of the first capacitor dielectric layer; and
forming a second capacitor structure on the first capacitor structure, the second capacitor structure including a second capacitor dielectric layer, a second upper electrode, and a plurality of second lower electrodes arranged at intervals; wherein the second lower electrodes are of a U-shaped structure, bottoms of the second lower electrodes are in contact with tops of the first lower electrodes, the second capacitor dielectric layer is at least located on surfaces of the second lower electrodes, and the second upper electrode is located on a surface of the second capacitor dielectric layer and fills up gaps at an outer side of the second capacitor dielectric layer.

Based upon the same inventive concept, also provided in the embodiments of the present application is a capacitor device, including a substrate, a first capacitor structure and a second capacitor structure that are successively stacked from bottom to top; wherein,
the first capacitor structure includes:
a plurality of first lower electrodes arranged on the substrate at intervals and each having a columnar structure;
a first capacitor dielectric layer at least covering sidewalls of the first lower electrodes; and
a first upper electrode located on a surface of the first capacitor dielectric layer and filling up gaps between the adjacent first lower electrodes;
the second capacitor structure includes:
second lower electrodes each having a U-shaped structure, bottoms of the second lower electrodes being in contact with tops of the first lower electrodes;
a second capacitor dielectric layer at least covering surfaces of the second lower electrodes; and
a second upper electrode located on the surface of the second capacitor dielectric layer and filling up gaps at inner sides of the second lower electrodes.

Based on the same inventive concept, also provided in the embodiments of the present application is a memory that employs the capacitor device according to any of the above embodiments. The memory further includes: a transistor formed on a surface of the substrate, and a capacitor contact structure one end of which is connected with the transistor, wherein the bottoms of the first lower electrodes are connected with the other end of the capacitor contact structure.

BRIEF DESCRIPTION OF DRAWINGS

In order to more clearly illustrate the embodiments of the present application or the technical solutions of the traditional technology, the accompanying drawings required to be used in the description of the embodiments or traditional techniques will be briefly introduced below. Apparently, the accompanying drawings in the following description show merely some embodiments of the present application, and persons of ordinary skill in the art may still derive other drawings from these accompanying drawings without creative efforts.

DESCRIPTION OF EMBODIMENTS

Figure 1:
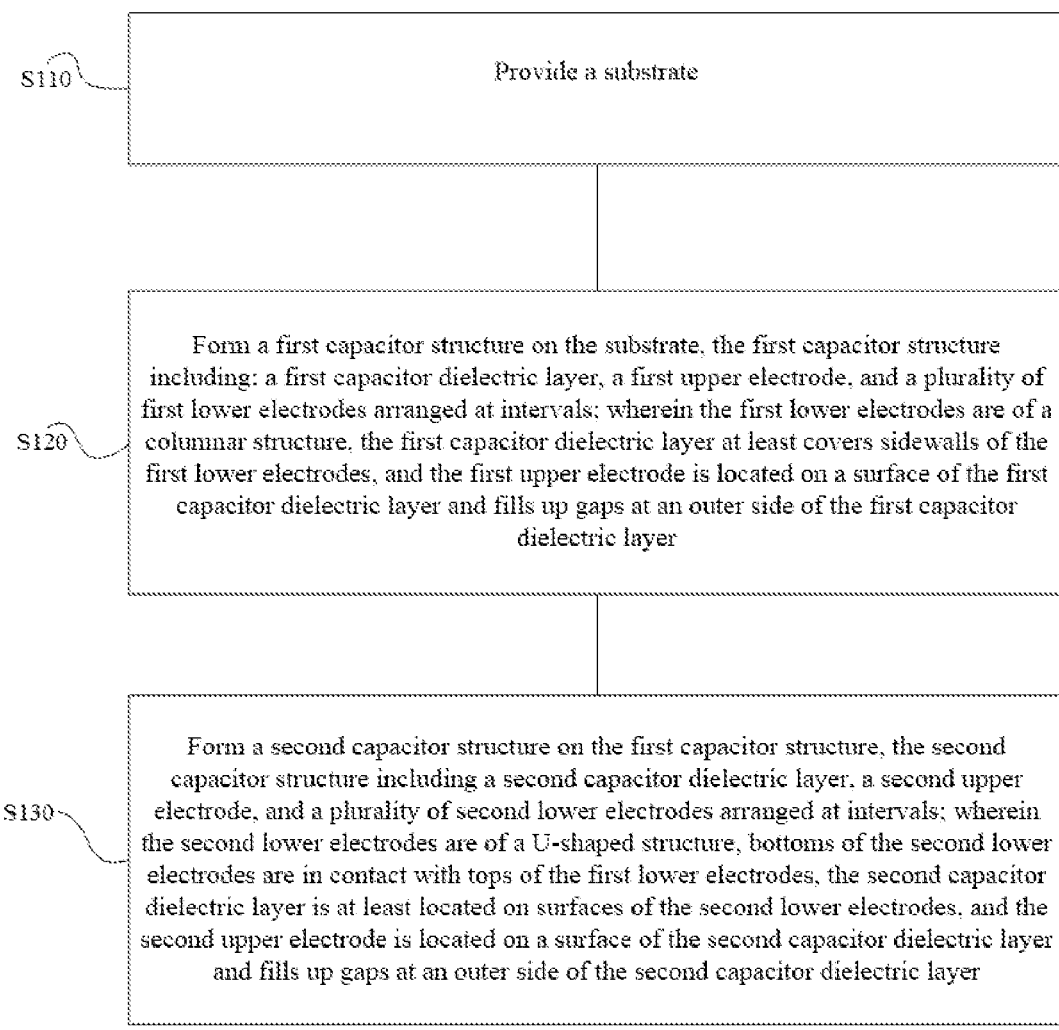
FIG. 1 is a flow chart illustrating a manufacturing method of a capacitor device according to an embodiment.

In order to facilitate understanding the present application, a more complete description of the present application is provided below with reference to the relevant drawings. The embodiments of the present application are given in the drawings. However, the present application may be implemented in a number of different ways without limiting to the embodiments described herein. Instead, the purposes of providing these embodiments are leading to a more thorough and complete understanding of the disclosure of the present application.

Unless otherwise defined, all of the technical and scientific terms used herein have the same meanings as would generally be understood by the person skilled in the technical field of the present invention. In this document, the terms used in the description of the present application is merely for the purpose of describing particular embodiments, and is not intended to limit the present application.

Referring to FIG. 1, provided in an embodiment is a manufacturing method of a capacitor device, including:

S110: providing a substrate 100;

S120: forming a first capacitor structure 200 on the substrate 100, the first capacitor structure 200 including: a first capacitor dielectric layer 220, a first upper electrode 230, and a plurality of first lower electrodes 210 arranged at intervals; wherein the first lower electrodes 210 are of a columnar structure, the first capacitor dielectric layer 220 at least covers sidewalls of the first lower electrodes 210, and the first upper electrode 230 is located on a surface of the first capacitor dielectric layer 220 and fills up gaps at an outer side of the first capacitor dielectric layer 220; and S130: forming a second capacitor structure 300 on the first capacitor structure 200, the second capacitor structure 300 including a second capacitor dielectric layer 320, a second upper electrode 330, and a plurality of second lower electrodes 310 arranged at intervals; wherein the second lower electrodes 310 are of a U-shaped structure, bottoms of the second lower electrodes 310 are in contact with tops of the first lower electrodes 210, the second capacitor dielectric layer 320 is at least located on surfaces of the second lower electrodes 310, and the second upper electrode 330 is located on a surface of the second capacitor dielectric layer 320 and fills up gaps at an outer side of the second capacitor dielectric layer 320.

In this embodiment, by forming the first capacitor structure 200 at first and then forming the second capacitor structure 300 on the first capacitor structure 200, i.e., forming the first capacitor structure 200 and the second capacitor structure 300 that are stacked, the total surface areas of the first capacitor dielectric layer 220 and the second capacitor dielectric layer 320 are effectively increased, and the requirements of memory capacitors can be satisfied; furthermore, since the first capacitor structure 200 and the second capacitor structure 300 are formed in a stepwise manner, the requirements for etching and film plating capabilities are lowered and the quality of capacitors are enhanced.

Figure 2:
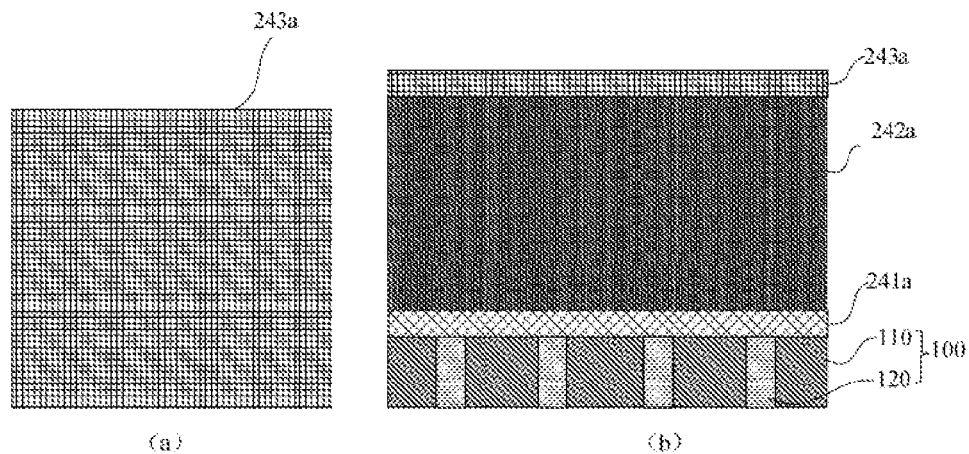
FIG. 2 to FIG. 11 are schematic structural sectional and top-view diagrams of a structure resulting from S120 in the manufacturing method of a first capacitor structure according to an embodiment.
Figure 3:
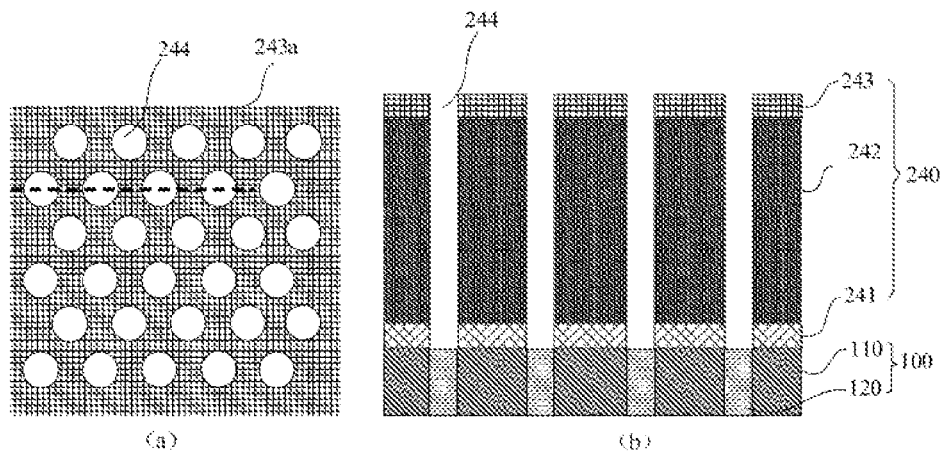
Figure 4:
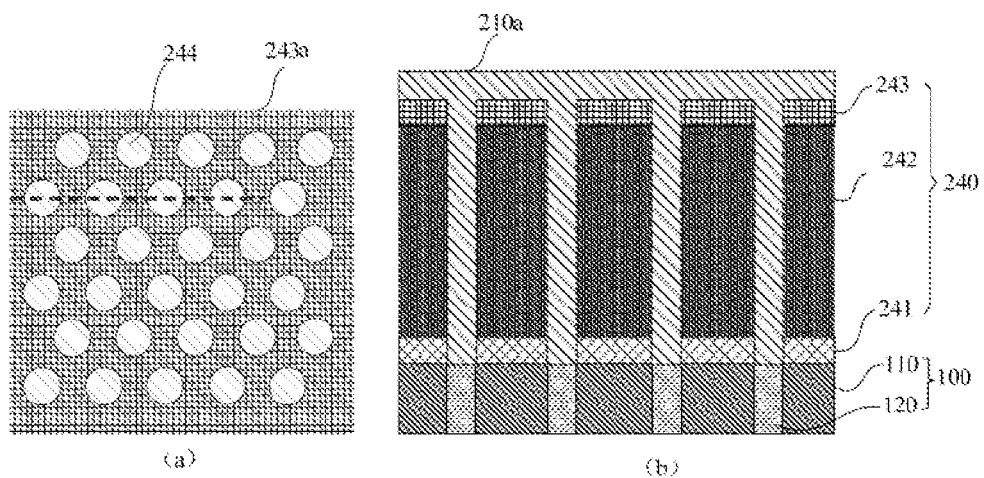
Figure 5:
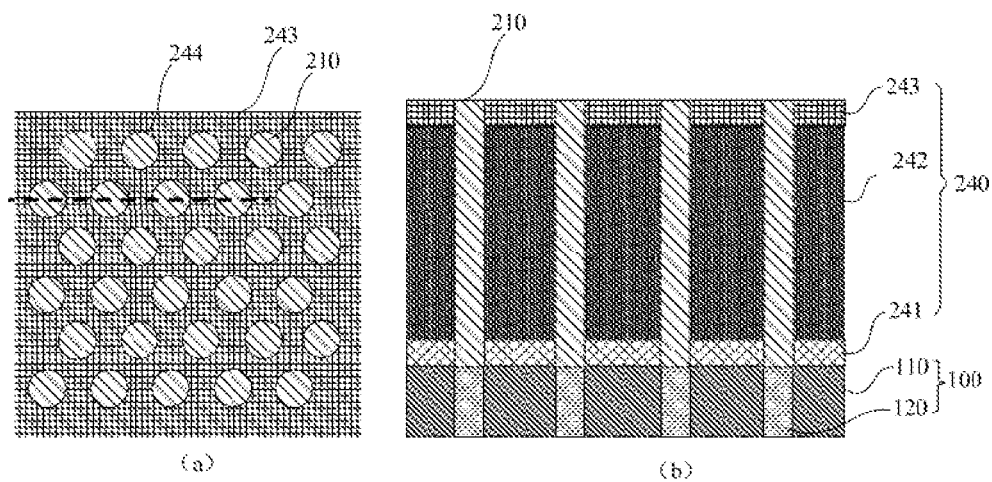
Figure 6:
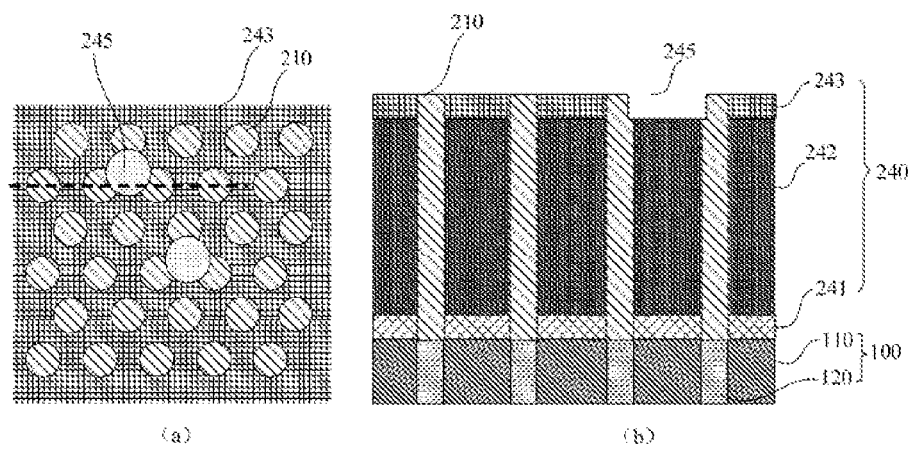
Figure 7:
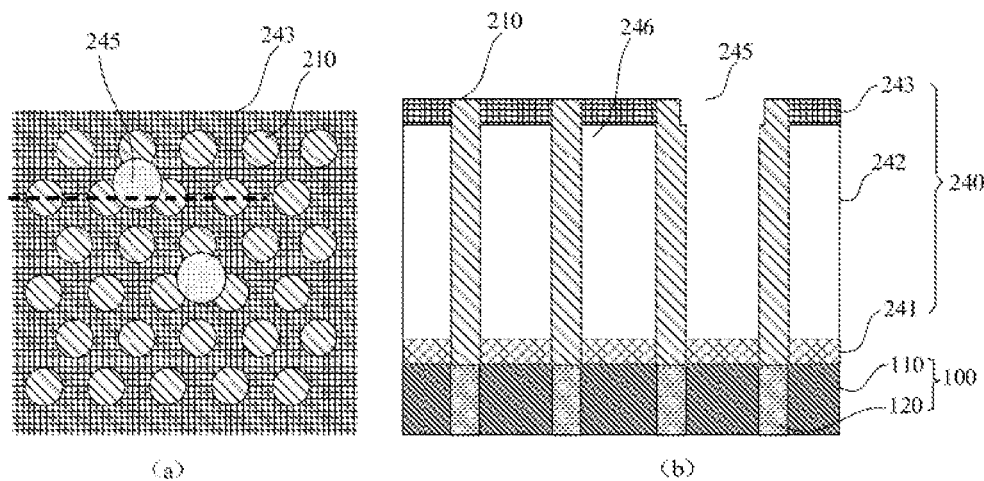

Referring to FIG. 2 to FIG. 11, in S120, the forming a first capacitor structure on the substrate includes:

forming, on the substrate 100, a first stack structure 240 including a first support layer 241, a first sacrificial layer 242 and a second support layer 243 that are successively stacked from bottom to top, as shown in FIG. 2, wherein the drawing (a) in FIG. 2 is a top-view diagram of a structure resulting from S1201, and the drawing (b) in FIG. 2 is a schematic structural partial sectional diagram of the drawing (a) in FIG. 2;

etching the first stack structure 240 to form a plurality of first capacitor holes 244, bottoms of the first capacitor holes 244 being exposed out of the substrate 100, as shown in FIG. 3, wherein the drawing (a) in FIG. 3 is a top-view diagram of a structure resulting from S1202, and the drawing (b) in FIG. 3 is a schematic structural sectional diagram of the drawing (a) in FIG. 3;

forming the first lower electrodes 210 within the first capacitor holes 244, as shown in FIG. 4 to FIG. 5, wherein the drawing (a) in FIG. 4 and the drawing (a) in FIG. 5 are top-view diagrams of a structure resulting from S1203, the drawing (b) in FIG. 4 is a schematic structural partial sectional diagram of the drawing (a) in FIG. 4, and the drawing (b) in FIG. 5 is a schematic structural partial sectional diagram of the drawing (a) in FIG. 5;

forming at least one opening 245 within the second support layer 243, the opening 245 being exposed out of the first sacrificial layer 242, as shown in FIG. 6, wherein the drawing (a) in FIG. 6 is a top-view diagram of a structure resulting from S1204, and the drawing (b) in FIG. 6 is a schematic structural sectional diagram of the drawing (a) in FIG. 6;

removing, based on the opening 245, the first sacrificial layer 242 to form a hollow gap 246, as shown in FIG. 7, wherein the drawing (a) in FIG. 7 is a top-view diagram of a structure resulting from S1205, and the drawing (b) in FIG. 7 is a schematic structural sectional diagram of the drawing (a) in FIG. 7;

forming the first capacitor dielectric layer 220 on sidewall surfaces of the first lower electrodes 210; and forming the first upper electrode 230 on an outer surface of the first capacitor dielectric layer 220 and filling up the hollow gap 246.

Referring to FIG. 2, the substrate 100 in this embodiment is a semiconductor substrate, an isolation layer 110 is arranged on the substrate, and a plurality of spaced-apart contact plugs 120 are formed in the isolation layer 110.

The above-described step of forming, on the substrate 100, a first stack structure 240 including a first support layer 241, a first sacrificial layer 242 and a second support layer 243 that are successively stacked from bottom to top, includes:

forming a first support material layer 241a, a first sacrificial material layer 242a and a second support material layer 243a by successive deposition on a semiconductor substrate via a deposition process. The deposition process may include chemical vapor deposition (CVD), low pressure CVD (LPCVD), plasma enhanced CVD (PECVD), atomic layer deposition (ALD) and plasma enhanced ALD (PEALD). In this embodiment, the first support material layer 241a and the second support material layer 243a may be made of silicon nitride, and the first sacrificial material layer 242a is made of an oxide material, e.g., Boro-phospho-silicate Glass (BPSG). It is noted that the height of the first lower electrodes is dictated by the thickness of the first stack structure 240 and the height of the first upper electrode 230 is dictated by the thickness of the first sacrificial layer 242, as a result of which the thicknesses of various layers need to be considered and set in accordance with the entire layout of the capacitor structure during the manufacturing process.

Referring to FIG. 3, the step of etching the first stack structure 240 to form a plurality of first capacitor holes 244 specifically includes:

forming a mask pattern (not illustrated) on the first stack structure 240. In this embodiment, the step specifically includes: first forming a hard mask layer and an anti-reflection layer successively on the first stack structure 240 by use of the deposition process, and coating a layer of photoresist on the surface of the anti-reflection layer so as to form a photoresist layer, wherein the material for the hard mask layer may be a nitride or an oxide, e.g., silicon oxynitride, silicon-carbon oxide or the like, and the anti-reflection layer may be made of an anti-reflection material, carbon, etc.; secondly, subjecting the photoresist layer to such steps as exposure and cleaning in order to form a pattern that defines the first capacitor holes 244; then, with the photoresist layer utilized as a mask, etching the anti-reflection layer and transferring the pattern for the first capacitor holes 244 into the anti-reflection layer, followed by removal of the remaining photoresist; and finally, with the anti-reflection layer utilized as a mask, etching the hard mask layer and transferring the pattern for the first capacitor holes 244 into the hard mask layer. In addition, the first capacitor holes 244 may also be formed through a double-pattern process, and this is not described here.

Then, with the hard mask layer utilized as a mask, the first stack structure 240 is etched, the pattern for the first capacitor holes 244 is transferred to the first stack structure 240, a plurality of first capacitor holes 244 arranged at intervals are formed in the first stack structure 240, and the first capacitor holes 244 are exposed out of the contact plugs 120.

Referring to FIG. 4 and FIG. 5, the above-described step of forming the first lower electrodes 210 within the first capacitor holes 244 specifically includes the follows.

1. The first capacitor holes 244 are filled up with a conductive material, so as to form a first lower electrode material layer 210a, which fills up the first capacitor holes 244 and covers the surface of the first stack structure 240, as shown in FIG. 4. In particular, the first lower electrode material layer 210a may be formed from any one or any combination of titanium nitride, titanium, tungsten silicide and tungsten nitride.
2. The conductive material at the top of the first stack structure 240 is removed using a chemical mechanical polishing process or an etching process, so as to form the plurality of first lower electrodes 210, as shown in FIG. 5. The tops of the first lower electrodes 210 are flush with the top of the first stack structure 240, and the first lower electrodes 210 are located above the contact plugs 120 and come into contact with the contact plugs 120.

Referring to FIG. 6, the step of forming at least one opening 245 within the second support layer 243 specifically includes: forming a pattern matched with the opening 245 on the second support layer 243 by utilizing a photo etching process, and with the pattern matched with the opening 245 as a mask, etching the second support layer 243 to form at least one opening 245 within the second support layer 243. According to one of the embodiments, the opening 245 has a round, triangular, quadrangular or irregular sectional shape. In this embodiment, the opening 245 may have a round sectional shape; and it is to be understood that round patterns help lower the etching requirements.

According to one of the embodiments, the opening 245 overlaps the plurality of first lower electrodes 210. It is to be understood that due to the small size of the capacitor structure, the critical size of the first capacitor structure is also small and there are relatively small gaps between the first lower electrodes 210. Therefore, the area of the first sacrificial layer 242 exposed out of the opening 245 may be increased through overlapping of the opening 245 with the plurality of first lower electrodes 210, thereby accelerating the removal of the first sacrificial layer 242. In this embodiment, the opening 245 overlaps three first lower electrodes 210. Moreover, overlapping of the opening 245 with the first lower electrodes 210 can be avoided by controlling the diameter of the opening 245.

Further, according to some of the embodiments, the area of the first sacrificial layer 242 exposed may also be increased by forming a plurality of openings 245, in order to achieve the purpose of accelerating the removal of the first sacrificial layer 242. Generally, 2 to 4 openings are designed during a specific implementation process.

Referring to FIG. 7, the above-described step of removing, based on the opening 245, the first sacrificial layer 242 to form a hollow gap 246 specifically includes: removing the first sacrificial layer 242 through the opening 245 by using wet chemical etching, to form the hollow gap 246. It is to be understood that when the first sacrificial layer 242 is removed using hydrofluoric acid HF, etching for the first lower electrodes 210, the first support layer 241 and the second support layer 243 can be omitted because the first sacrificial layer 242 has a higher etch selectivity than the first lower electrodes 210 made of a metal as well as the first support layer 241 and the second support layer 243 made of a nitride.

Figure 8:
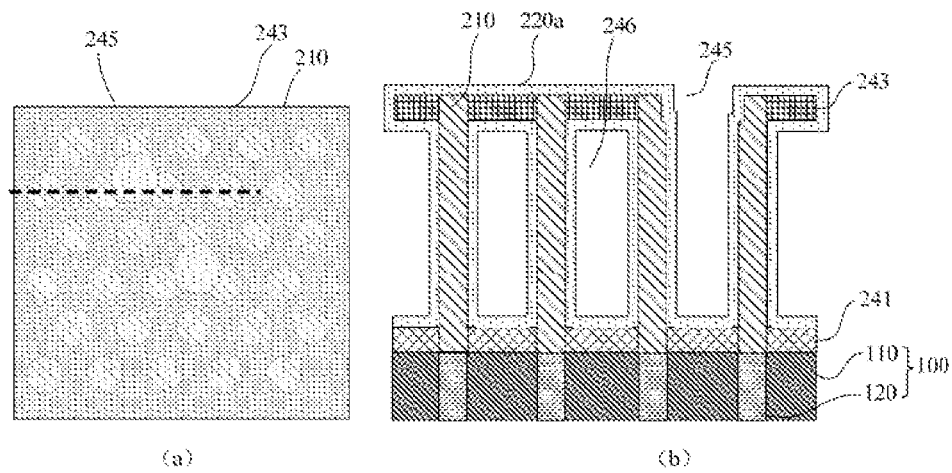
Figure 9:
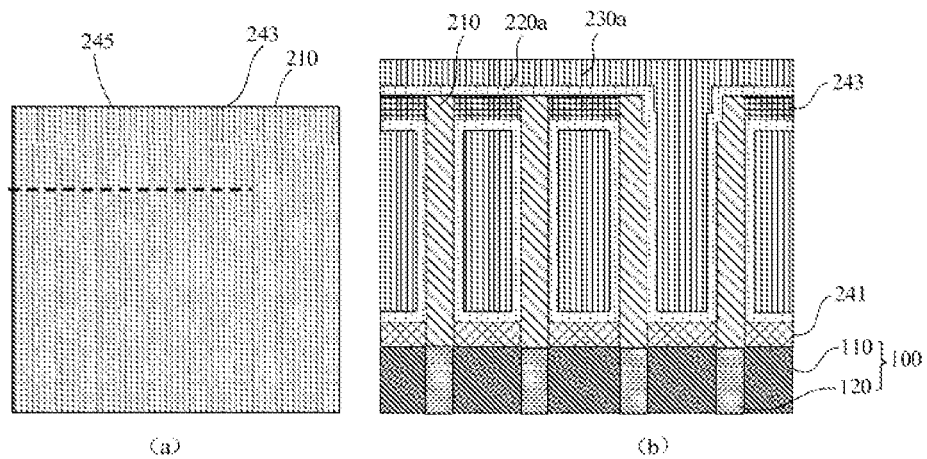
Figure 10:
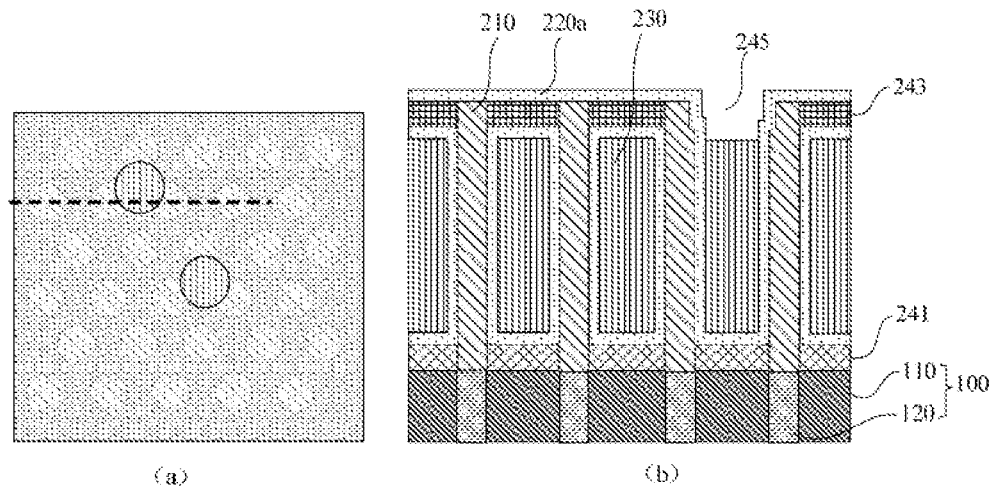

With reference to FIG. 8 to FIG. 10, the step of forming the first capacitor dielectric layer 220 and the step of forming the first upper electrode 230 may be mutually combined, and may specifically include the following steps.

Step 1: through a deposition process, a first dielectric material layer 220a is formed that covers the surface of the hollow gap 246, the tops of the first lower electrodes 210 and the top of the second support layer 243, as shown in FIG. 8, wherein the drawing (a) in FIG. 8 is a top-view diagram of a structure resulting from this step, and the drawing (b) in FIG. 8 is a schematic structural sectional diagram of the drawing (a) in FIG. 8. It is to be understood that to increase the capacitance, the first dielectric material layer 220a is made of a dielectric material having a dielectric constant greater than 7. The commonly-used high-K dielectric materials include metal oxides of $Ta_2O_5$, $TiO_2$, $TiN$, $Al_2O_3$, $Pr_2O_3$, $La_2O_3$, $LaAlO_3$, $HfO_2$, $ZrO_2$ or other components.

Step 2: the hollow gap 246 is filled up with the conductive material, to form a first upper electrode material layer 230a. The first upper electrode material layer 230a fills up the hollow gap 246 and covers the surface of the first dielectric material layer 220a, as shown in FIG. 9, wherein the drawing (a) in FIG. 9 is a top-view diagram of a structure resulting from this step, and the drawing (b) in FIG. 9 is a schematic structural sectional diagram of the drawing (a) in FIG. 9. In this embodiment, the first upper electrode material layer 230a is made of the same material as the first lower electrode material layer 210a, and a detailed description thereof is not given here.

Step 3: with the first dielectric material layer 220a being utilized as an etch barrier, the first upper electrode material layer 230a is subjected to chemical mechanical polishing etching to remove the conductive material in the top of the first dielectric material layer 220a and in the opening 245, and thus to form the first upper electrode 230, as shown in FIG. 10, wherein the drawing (a) in FIG. 10 is a top-view diagram of a structure resulting from this step, and the drawing (b) in FIG. 10 is a schematic structural sectional diagram of the drawing (a) in FIG. 10.

Figure 11:
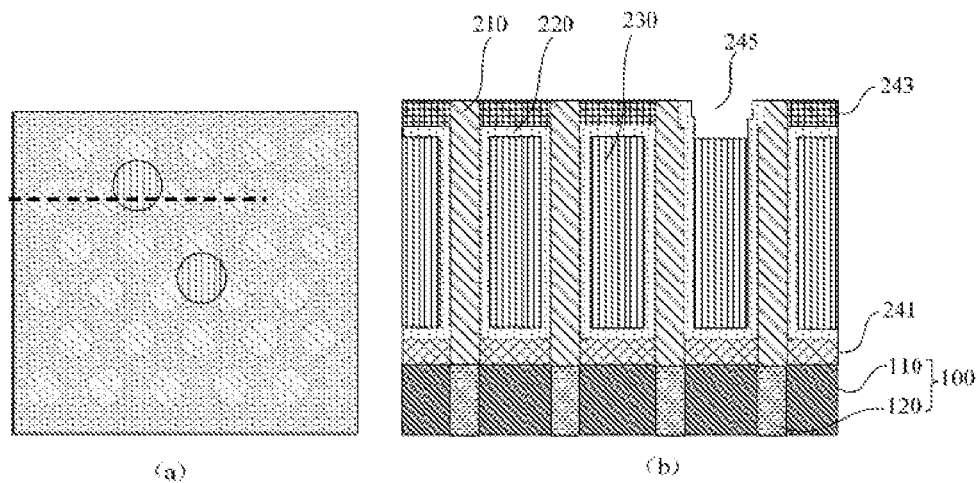

Step 4: the first dielectric material layer 220a located on the upper surface of the second support layer 243 is removed to form the first capacitor dielectric layer 220, as shown in FIG. 11, wherein the drawing (a) in FIG. 11 is a top-view diagram of a structure resulting from this step, and the drawing (b) in FIG. 11 is a schematic structural sectional diagram of the drawing (a) in FIG. 11.

Figure 12:
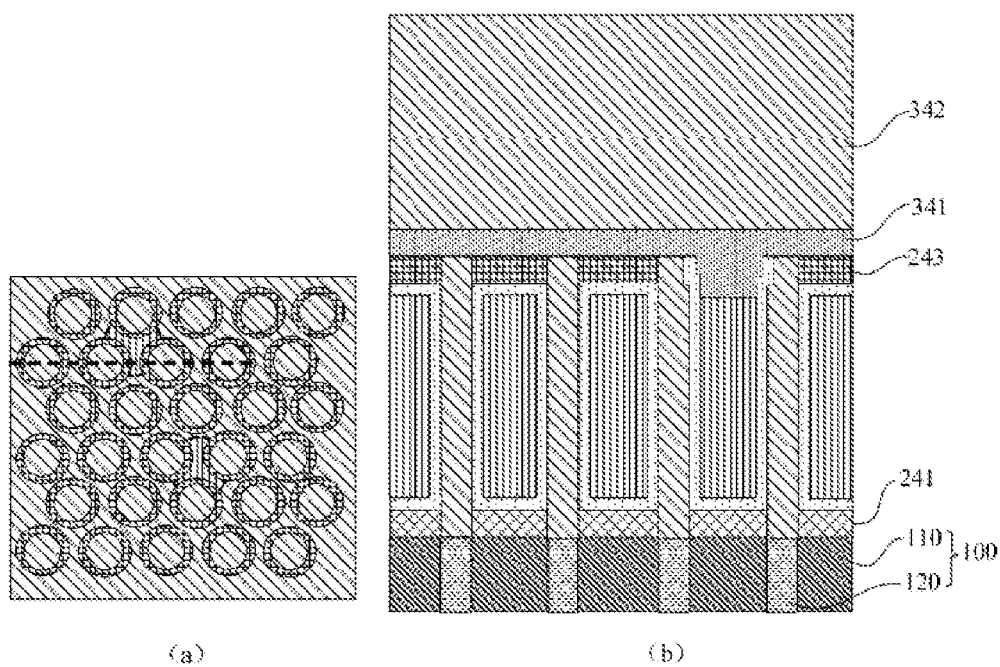
FIG. 12 to FIG. 19 are schematic structural sectional and top-view diagrams of a structure resulting from S130 in the manufacturing method of a second capacitor structure according to an embodiment.
Figure 13:
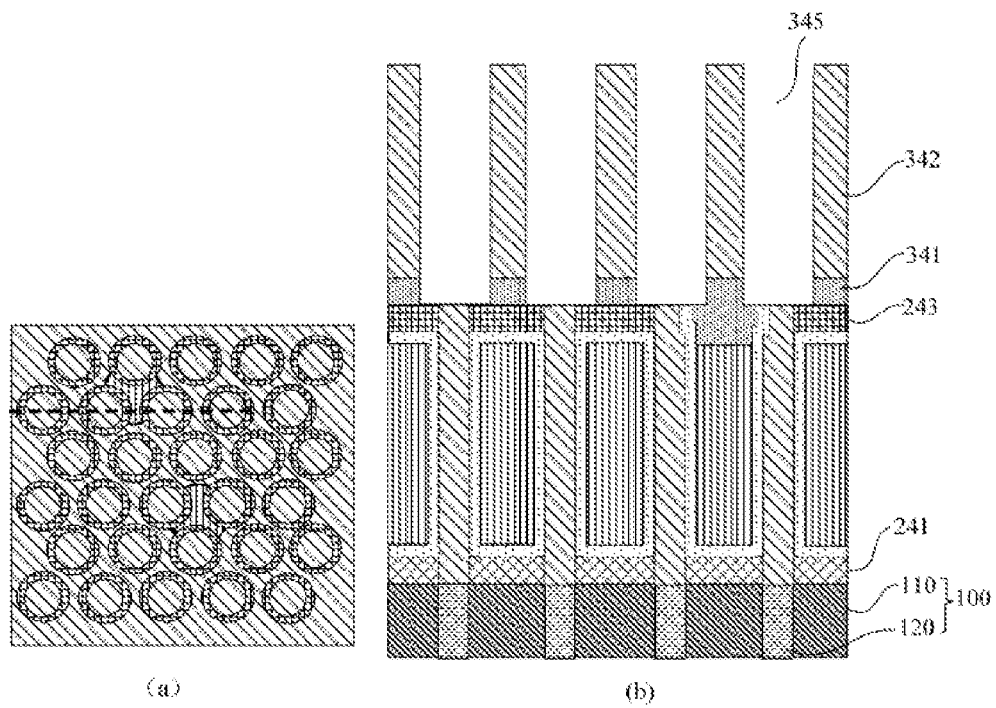
Figure 14:
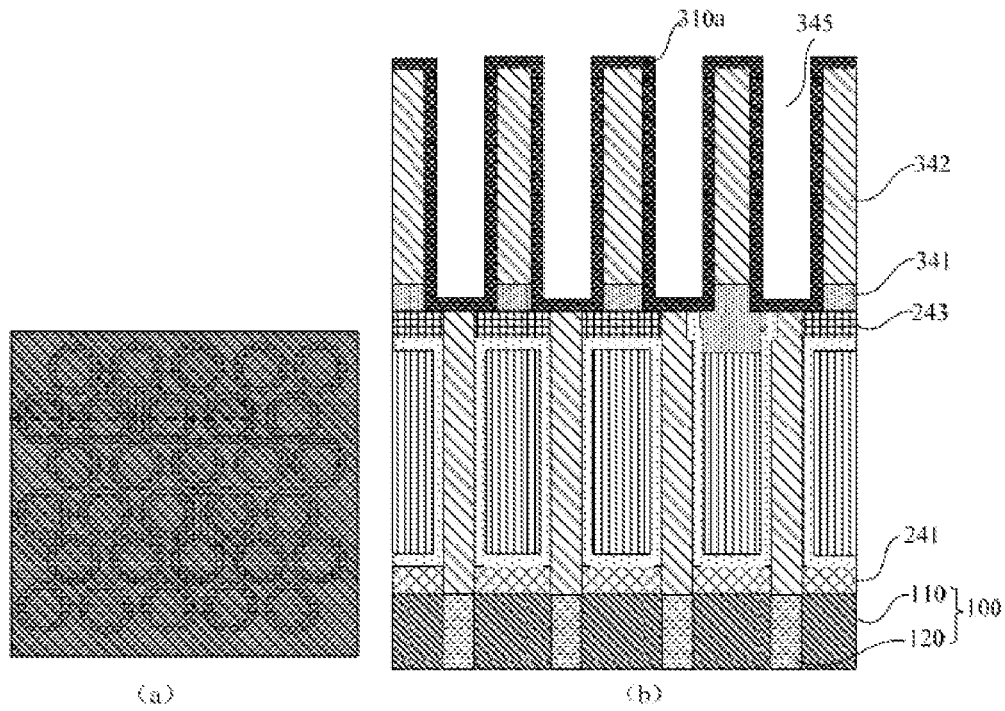
Figure 19:
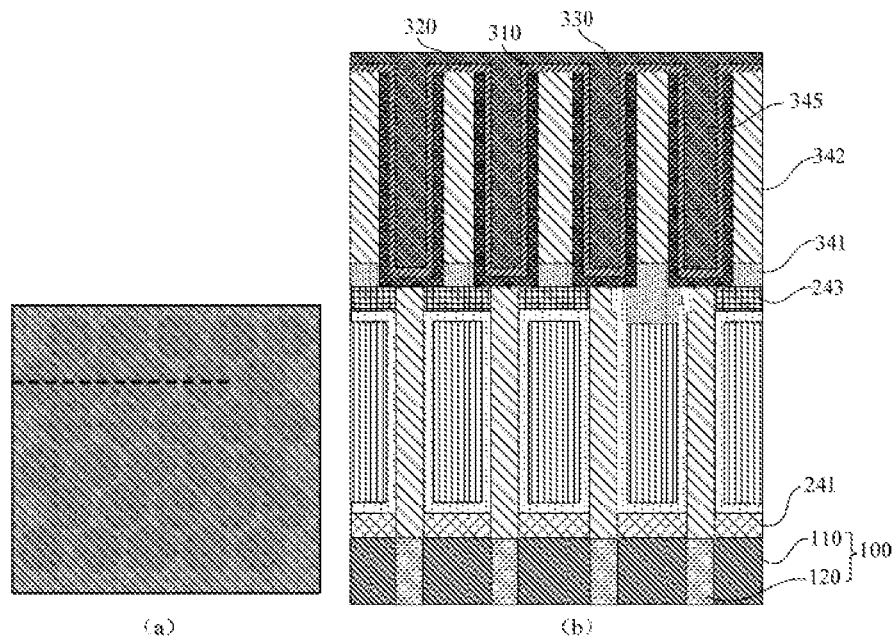

Referring to FIG. 12 to FIG. 19, in S130, the forming a second capacitor structure 300 on the first capacitor structure 200 includes:

forming, on an upper surface of the second support layer 243, a second stack structure 340 including a third support layer 341 and a fourth support layer 342 that are successively stacked from bottom to top, as shown in FIG. 12, wherein the drawing (a) in FIG. 12 is a top-view diagram of a structure resulting from this step, and the drawing (b) in FIG. 12 is a schematic structural sectional diagram of the drawing (a) in FIG. 12;

forming, within the second stack structure 340, a plurality of second capacitor holes 345 to penetrate through the third support layer 341 and the fourth support layer 342, the first lower electrodes 210 being exposed out of the bottoms of the second capacitor holes 345, as shown in FIG. 13, wherein the drawing (a) in FIG. 13 is a top-view diagram of a structure resulting from this step, and the drawing (b) in FIG. 13 is a schematic structural sectional diagram of the drawing (a) in FIG. 13;

forming the second lower electrodes 310 on the sidewalls and bottoms of the second capacitor holes 345, as shown in FIG. 14, wherein the drawing (a) in FIG. 14 is a top-view diagram of a structure resulting from this step, and the drawing (b) in FIG. 14 is a schematic structural sectional diagram of the drawing (a) in FIG. 14;

forming the second capacitor dielectric layer 320, the second capacitor dielectric layer 320 at least covering the surfaces of the second lower electrodes 310, as shown in FIG. 15 to FIG. 18;

forming the second upper electrode 330 on the surface of the second capacitor dielectric layer 320, and the second upper electrode 330 at least filling up the gaps between the second lower electrodes 310, as shown in FIG. 19.

Referring to FIG. 12, the above-described step of forming, on an upper surface of the second support layer 243, a second stack structure 340 specifically includes: forming a third support layer 341 by depositing an insulating material with a low dielectric constant (i.e., low-K) through a deposition process; and then, continuing to deposit the low-K insulating material to form a fourth support layer 342. Wherein the low-K insulating material, carbon-doped oxides or the like; the third support layer 341 and the fourth support layer 342 are formed by utilizing the low-K insulating material such that parasitic capacitance between the capacitor structures can be reduced and the phenomenon of current leakage can be prevented.

Referring to FIG. 13, the above-described step of forming, within the second stack structure 340, a plurality of second capacitor holes 345, specifically includes: forming, on the fourth support layer 342, a hard mask (for the process of formation of the hard mask, reference shall be made to the process of manufacturing of the first capacitor holes 244, and a detailed description thereof is not given here) that defines the second capacitor holes 345; in case that the hard mask including the pattern for the second capacitor holes 345 is utilized as a mask, etching the third support layer 341 and the fourth support layer 342 until the first lower electrodes 210 are exposed, and transferring the pattern for the second capacitor holes 345 into the second stack structure 340, so as to form the plurality of spaced-apart second capacitor holes 345.

According to one of the embodiments, the first capacitor holes 244 are in one-to-one correspondence with the second capacitor holes 345, the first capacitor holes 244 have a diameter less than the second capacitor holes 345, i.e., the second lower electrodes 310 are arranged in one-to-one correspondence with the first lower electrodes 210, and the second lower electrodes 310 have a width greater than the first lower electrodes 210. It is to be understood that if the width of the second lower electrodes 310 is greater than the width size of the first lower electrodes 210, then the difficulty of aligning the first capacitor structure 200 with the second capacitor structure 300 can be lowered and serial connection of the capacitor structure in two layers can be facilitated, and the fact that the second lower electrodes 310 are arranged in one-to-one correspondence with the first lower electrodes 210 may further widen the total surface area of the capacitor dielectric layers, thus increasing the capacitance.

Referring to FIG. 14 to FIG. 17, the step of forming the second lower electrodes 310 on the sidewalls and bottoms of the second capacitor holes 345 specifically includes.

Figure 15:
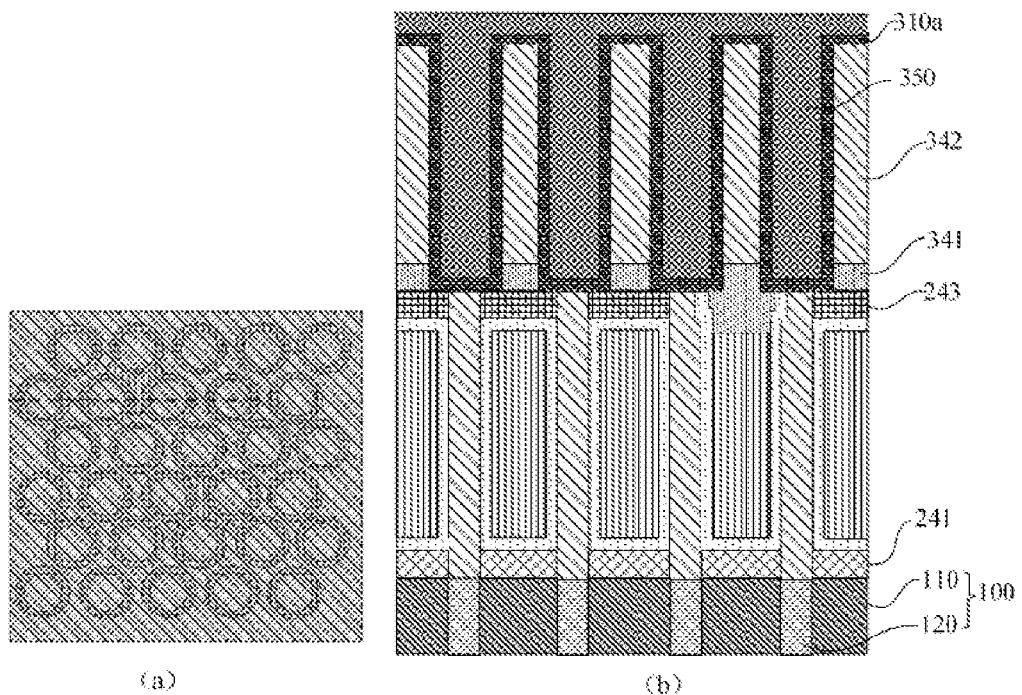
Figure 16:
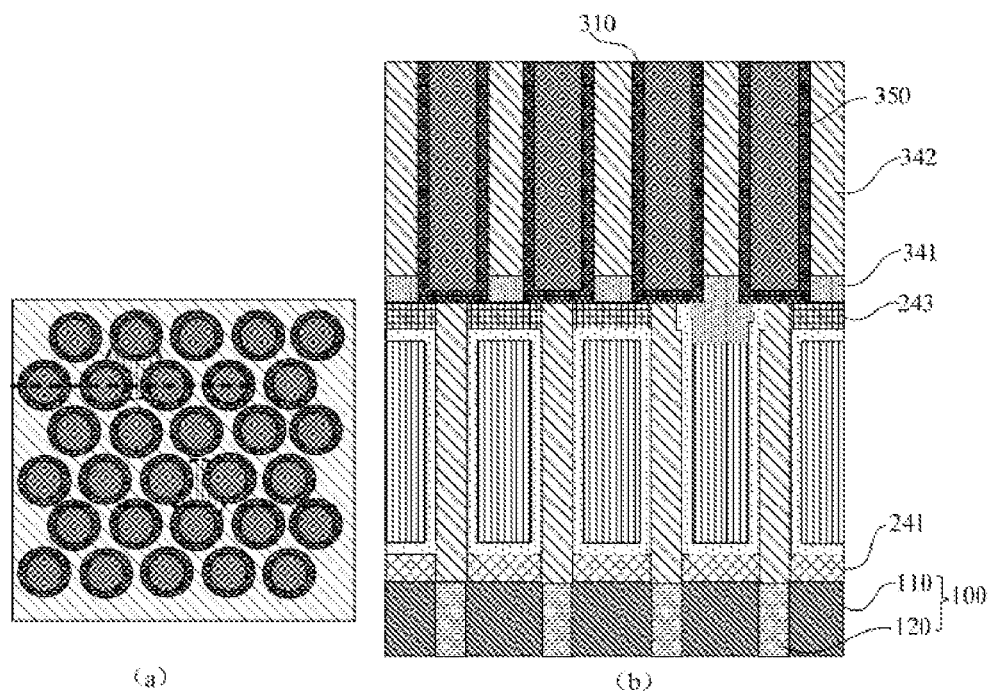
Figure 17:
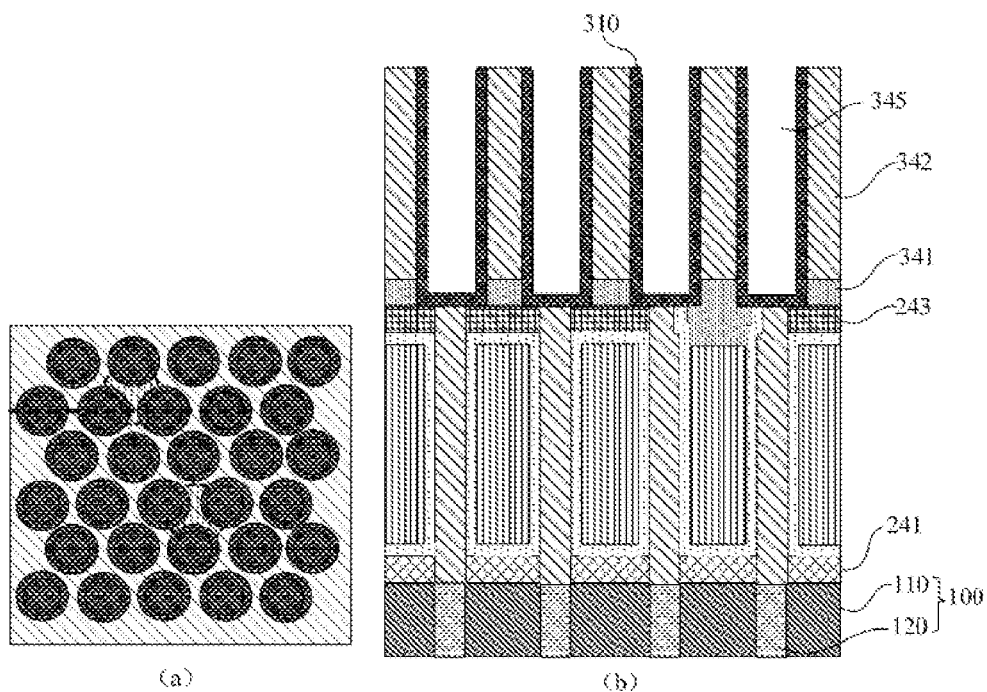

1) forming, by depositing a conductive material through a deposition process, a second lower electrode material layer 310a that covers the surface of the first capacitor holes 244 and the top of the fourth support layer 342, as shown in FIG. 14;

2) forming a second sacrificial layer 350 filling up the second capacitor holes 345, the second sacrificial layer 350 filling up the second capacitor holes 345 and covering the surface of the second lower electrode material layer 310a, as shown in FIG. 15, wherein the drawing (a) in FIG. 15 is a top-view diagram of a structure resulting from this step, and the drawing (b) in FIG. 15 is a schematic structural sectional diagram of the drawing (a) in FIG. 15;

3) etching, by utilizing, but not limited to, a chemical mechanical polishing process or an etching process, the second lower electrode material layer 310a and the second sacrificial layer 350, to expose the top of the fourth support layer 342 and form the plurality of spaced-apart second lower electrodes 310, as shown in FIG. 16, wherein the drawing (a) in FIG. 16 is a top-view diagram of a structure resulting from this step, and the drawing (b) in FIG. 16 is a schematic structural sectional diagram of the drawing (a) in FIG. 16; and 4) removing the remaining second sacrificial layer 350, as shown in FIG. 17, wherein the drawing (a) in FIG. 17 is a top-view diagram of a structure resulting from this step, and the drawing (b) in FIG. 17 is a schematic structural sectional diagram of the drawing (a) in FIG. 17.

According to one of the embodiments, the second sacrificial layer 350 has an etch selectivity greater than 1 relative to the second lower electrodes 310 and the fourth support layer 342. In particular, the second sacrificial layer 350 is made of a carbonaceous material. For example, in this embodiment, the fourth support layer 342 is made of a BPSG material and the second lower electrodes 310 are made of the metal tungsten, so the remaining second sacrificial layer 350 can be removed using one or more of etching gases like $SF_6$, $CF_x$, and $Cl_2$.

Figure 18:
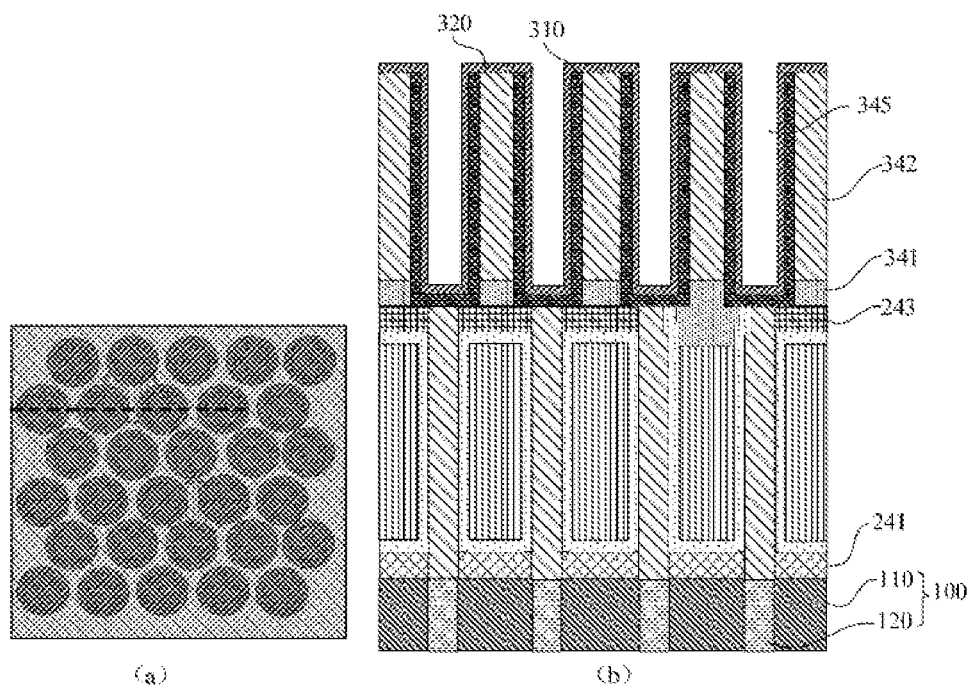

The above-described step of forming the second capacitor dielectric layer 320 includes: forming, by depositing a dielectric material with a high dielectric constant such as $Si_3N_4$, $ZrO_2$, TiOX, $HfO_2$, etc., a second capacitor dielectric layer 320 covering the surfaces of the second lower electrodes 310; in this embodiment, the second capacitor dielectric layer 320 covers the surfaces of the second lower electrodes 310 and the top of the fourth support layer 342, as shown in FIG. 18, wherein the drawing (a) in FIG. 18 is a top-view diagram of a structure resulting from this step, and the drawing (b) in FIG. 18 is a schematic structural sectional diagram of the drawing (a) in FIG. 18. In addition, since there is no need in this embodiment to peel off the oxide (i.e., the fourth support layer 342) between two second lower electrodes 310, additional arrangement of a nitride support layer is not required and meanwhile the second capacitor structure may also be pushed higher.

The step of forming the second upper electrode 330 specifically includes: forming, by filling up the second capacitor holes 345 with a conductive material, the second upper electrode 330 filling up the second capacitor holes 345 and covering the surface of the second capacitor dielectric layer 320, and thus forming a capacitor structure having the first capacitor structure 200 and the second capacitor structure 300 stacked, as shown in FIG. 19, wherein the drawing (a) in FIG. 19 is a top-view diagram of a structure resulting from this step, and the drawing (b) in FIG. 19 is a schematic structural sectional diagram of the drawing (a) in FIG. 19.

Figure 20:
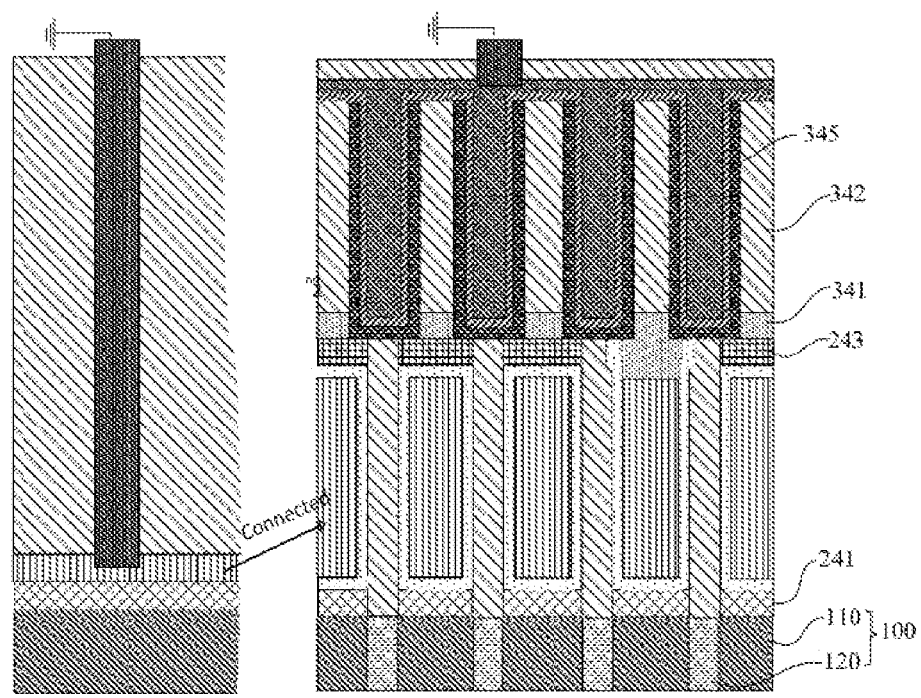
FIG. 20 is a schematic structural sectional diagram illustrating completion of the connection between the first upper electrode and the second upper electrode according to an embodiment.

According to one of the embodiments, to realize the serial connection between the first capacitor structure 200 and the second capacitor structure 300, the manufacturing method further includes: connecting, through a metal interconnecting process, the first upper electrode 230 and the second upper electrode 330, as shown in FIG. 20, wherein the drawing (a) in FIG. 20 is a top-view diagram of a structure resulting from this step, and the drawing (b) in FIG. 20 is a schematic structural sectional diagram of the drawing (a) in FIG. 20. In particular, a connecting structure is formed at peripheral areas, and the first upper electrode 230 and the second upper electrode 330 are electrically connected by the connecting structure.

According to one of the embodiments, the height of the top of the second upper electrode 330 relative to the bottoms of the first lower electrodes 210 is 1000 to 1500 nm. In this embodiment, the sum of the heights of the first capacitor structure 200 and the second capacitor structure 300 is 1000 to 1500 nm, in order to ensure the requirements for capacitance in semiconductor memories. During the specific manufacturing process, the height of the first capacitor structure 200 and the height of the second capacitor structure 300 may be the same or different.

Based upon the same inventive concept, also provided in the embodiments of the present application is a capacitor structure, which, with continued reference to FIG. 19, includes a substrate 100, a first capacitor structure 200 and a second capacitor structure 300 that are successively stacked from bottom to top.

The first capacitor structure 200 includes: a plurality of first lower electrodes 210, a first capacitor dielectric layer 220 and a first upper electrode 230, wherein the first lower electrodes 210 are arranged on the substrate 100 at intervals and are of a columnar structure; the first capacitor dielectric layer 220 at least covers sidewalls of the first lower electrodes 210; and the first upper electrode 230 is located on a surface of the first capacitor dielectric layer 220 and fills up gaps between the adjacent first lower electrodes 210.

The second capacitor structure 300 includes: second lower electrodes 310, a second capacitor dielectric layer 320 and a second upper electrode 330, wherein the second lower electrodes 310 are of a U-shaped structure, and bottoms of the second lower electrodes 310 are in contact with tops of the first lower electrodes 210; the second capacitor dielectric layer 320 at least covers surfaces of the second lower electrodes 310; and the second upper electrode 330 is located on the surface of the second capacitor dielectric layer 320 and fills up gaps at inner sides of the second lower electrodes 310.

According to one of the embodiments, the width of the second lower electrodes 310 is greater than the width of the first lower electrodes 210 such that the difficulty of aligning the first capacitor structure 200 with the second capacitor structure 300 can be lowered and serial connection of the capacitor structure in two layers can be facilitated.

According to one of the embodiments, the first capacitor structure 200 further includes a first support layer 241 and a second support layer 243, wherein the first support layer 241 is located between the substrate 100 and the first capacitor dielectric layer; the second support layer 243 is located above the first support layer 241, has a spacing relative to the first support layer 241 and is located between the first upper electrode 230 and the second capacitor structure 300. The second capacitor structure 300 further includes a third support layer 341 and a fourth support layer 342, wherein the third support layer 341 is located above the second support layer 243 and sandwiched between the two adjacent second lower electrodes 310; the fourth support layer 342 is located above the third support layer 341 and sandwiched between the two adjacent second lower electrodes 310. It is to be understood that, with the arrangement of the first support layer 241 and the second support layer 243, the first lower electrodes 210 can be prevented from collapsing when the first sacrificial layer 242 is removed. And with the arrangement of the third support layer 341 and the fourth support layer 342, the U-shaped second lower electrodes 310 can be formed and can also be prevented from collapsing.

According to one of the embodiments, both the first capacitor dielectric layer and the second capacitor dielectric layer 320 are made of a dielectric material having a dielectric constant greater than 7. It is to be understood that, the fact that the first capacitor dielectric layer and the second capacitor dielectric layer 320 are made of a dielectric material having a dielectric constant greater than 7 facilitates an increase in the capacitance of the capacitor structure.

According to one of the embodiments, the first lower electrodes, the first upper electrode, the second lower electrodes and the second upper electrode are all made of a conductive material;

wherein the conductive material includes one or more of polysilicon, titanium, titanium nitride and tungsten.

According to one of the embodiments, the first lower electrodes and the second lower electrodes are made of the same conductive material.

According to one of the embodiments, the height of the top of the second upper electrode relative to the bottoms of the first lower electrodes is 1000 to 1500 nm. In this embodiment, the sum of the heights of the first capacitor structure 200 and the second capacitor structure 300 is 1000 to 1500 nm, in order to ensure the requirements for capacitance in semiconductor memories. During the specific manufacturing process, the height of the first capacitor structure 200 and the height of the second capacitor structure 300 may be the same or different.

Based on the same inventive concept, also provided in the embodiments of the present application is a memory that employs the capacitor device according to any of the above embodiments. The memory further includes: a transistor formed on a surface of the substrate, and a capacitor contact structure one end of which is connected with the transistor, wherein the bottoms of the first lower electrodes are connected with the other end of the capacitor contact structure.

In conclusion, the embodiments of the present application provide a capacitor structure and a manufacturing method thereof, and a memory. The manufacturing method includes: providing a substrate; forming a first capacitor structure on the substrate, the first capacitor structure including: a first capacitor dielectric layer, a first upper electrode, and a plurality of first lower electrodes arranged at intervals; wherein the first lower electrodes are of a columnar structure, the first capacitor dielectric layer at least covers sidewalls of the first lower electrodes, and the first upper electrode is located on a surface of the first capacitor dielectric layer and fills up gaps at an outer side of the first capacitor dielectric layer; and forming a second capacitor structure on the first capacitor structure, the second capacitor structure including a second capacitor dielectric layer, a second upper electrode, and a plurality of second lower electrodes arranged at intervals; wherein the second lower electrodes are of a U-shaped structure, bottoms of the second lower electrodes are in contact with tops of the first lower electrodes, the second capacitor dielectric layer is at least located on surfaces of the second lower electrodes, and the second upper electrode is located on a surface of the second capacitor dielectric layer and fills up gaps at an outer side of the second capacitor dielectric layer.

According to the invention, by forming the first and second capacitor device that are stacked, the total surface areas of the first capacitor dielectric layer and the second dielectric layer are effectively increased. Furthermore, since the first and second capacitor structures are formed in a stepwise manner, the requirements for etching and film plating capabilities are lowered and the quality of capacitors are enhanced.

In the description of this specification, descriptions with reference to the terms "some embodiments", "other embodiments", "ideal embodiments", etc. mean that specific features, structures, materials or characteristics described in conjunction with the embodiment or example are included at least one embodiment or example of the present application. In this specification, a schematic description of the above-mentioned terms does not necessarily refer to the same embodiment or example.

Technical features of the above embodiments may be combined randomly. To make descriptions brief, not all possible combinations of the technical features in the above embodiments are described. Therefore, as long as there is no contradiction between the combinations of the technical features, they should all be considered as scopes disclosed in the specification.

The above embodiments only describe several implementations of the present application, and their description is specific and detailed, but cannot therefore be understood as a limitation on the patent scope of the present application. It should be noted that those of ordinary skill in the art may further make variations and improvements without departing from the conception of the present application, and these all fall within the protection scope of the present application. Therefore, the patent protection scope of the present application should be subject to the appended claims.

What is claimed is:

1. A method of manufacturing a capacitor device, comprising:
   providing a substrate;
   forming a first capacitor structure on the substrate, the first capacitor structure comprising: a first capacitor dielectric layer, a first upper electrode, a plurality of first lower electrodes arranged at intervals, a first support layer, and a second support layer; wherein the first lower electrodes are of a columnar structure, the first capacitor dielectric layer covers sidewalls of the first lower electrodes, and the first upper electrode is located on an outer surface of the first capacitor dielectric layer and fills up gaps at an outer side of the first capacitor dielectric layer, and the first support layer is located between the substrate and the first capacitor dielectric layer, and the second support layer is located above the first support layer, having a spacing relative to the first support layer, and located between the first upper electrode and the second capacitor structure; and
   forming a second capacitor structure on the first capacitor structure, the second capacitor structure comprising a second capacitor dielectric layer, a second upper electrode, a plurality of second lower electrodes arranged at intervals, a third support layer, and a fourth support layer; wherein the second lower electrodes are of a U-shaped structure, bottoms of the second lower electrodes are in contact with tops of the first lower electrodes, the second capacitor dielectric layer is located on surfaces of the second lower electrodes, and the second upper electrode is located on an outer surface of the second capacitor dielectric layer and fills up gaps at an outer side of the second capacitor dielectric layer, and the third support layer is located above the second support layer and sandwiched between the two adjacent second lower electrodes; and the fourth support layer is located above the third support layer and sandwiched between the two adjacent second lower electrodes.

2. The method according to claim 1, wherein said forming a first capacitor structure on the substrate comprises:
   forming a first stack structure on the substrate, the first stack structure comprising the first support layer, a first sacrificial layer and the second support layer that are successively stacked from bottom to top;
   etching the first stack structure to form a plurality of first capacitor holes, bottoms of the first capacitor holes exposing the substrate;
   forming the first lower electrodes in the first capacitor holes;
   forming at least one opening in the second support layer, the opening exposing the first sacrificial layer;
   removing, based on the opening, the first sacrificial layer to form a hollow gap;
   forming the first capacitor dielectric layer on sidewall surfaces of the first lower electrodes; and
   forming the first upper electrode on an outer surface of the first capacitor dielectric layer and filling up the hollow gap.

3. The method according to claim 2, wherein said forming the second capacitor structure on the first capacitor structure comprises:
   forming, on an upper surface of the second support layer, a second stack structure comprising the third support layer and the fourth support layer that are successively stacked from bottom to top;

forming a plurality of second capacitor holes in the second stack structure to penetrate through the third support layer and the fourth support layer, the first lower electrodes exposing the bottoms of the second capacitor holes;

forming the second lower electrodes on the sidewalls and bottoms of the second capacitor holes, and contacting with the first lower electrodes;

forming the second capacitor dielectric layer, the second capacitor dielectric layer at least covering the surfaces of the second lower electrodes; and forming the second upper electrode on the outer surface of the second capacitor dielectric layer, and filling up the second capacitor holes.

4. The method according to claim 3, wherein the second capacitor holes are arranged in one-to-one correspondence with the first capacitor holes.

5. The method according to claim 4, wherein the second capacitor holes have a diameter greater than the first capacitor holes.

6. The method according to claim 2, wherein the first sacrificial layer is removed through the opening by using wet chemical etching, and the first lower electrodes, the first support layer and the second support layer are reserved.

7. The method according to claim 2, wherein the opening has a round, triangular, quadrangular or irregular sectional shape.

8. The method according to claim 3, wherein the third support layer seals the opening and covers top surfaces of the first lower electrodes and the second support layer.

9. The method according to claim 3, wherein the forming the second lower electrodes on the sidewalls and bottoms of the second capacitor holes comprises:

depositing a conductive material to form a second lower electrode material layer covering surfaces of the second capacitor holes and the top of the fourth support layer;

forming a second sacrificial layer, the second sacrificial layer filling up the second capacitor holes and covering the surface of the second lower electrode material layer;

etching the second sacrificial layer and the second lower electrode material layer until the second lower electrode material layer at the top of the fourth support layer is removed, and reserving the second lower electrode material layer located at the sidewalls and bottoms of the second capacitor holes, as the second lower electrodes; and removing the remaining second sacrificial layer.

10. The method according to claim 9, wherein the second sacrificial layer is made of a carbonaceous material.

11. A capacitor device, comprising a substrate, a first capacitor structure and a second capacitor structure that are successively stacked from bottom to top; wherein the first capacitor structure comprises:

first lower electrodes arranged on the substrate at intervals and each having a columnar structure;

a first capacitor dielectric layer covering sidewalls of the first lower electrodes;

a first upper electrode located on an outer surface of the first capacitor dielectric layer and filling up gaps at an outer side of the adjacent first capacitor dielectric layer;

a first support layer located between the substrate and the first capacitor dielectric layer; and a second support layer located above the first support layer, having a spacing relative to the first support layer, and located between the first upper electrode and the second capacitor structure; and, wherein the second capacitor structure comprises:

second lower electrodes each having a U-shaped structure, bottoms of the second lower electrodes being in contact with tops of the first lower electrodes;

a second capacitor dielectric layer covering surfaces of the second lower electrodes;

a second upper electrode located on the surface of the second capacitor dielectric layer and filling up gaps at the outer side of the second capacitor dielectric layer;

a third support layer located above the second support layer and sandwiched between the two adjacent second lower electrodes; and a fourth support layer located above the third support layer and sandwiched between the two adjacent second lower electrodes.

12. The capacitor device according to claim 11, wherein the second lower electrodes have a width greater than the first lower electrodes.

13. The capacitor device according to claim 11, wherein both the first capacitor dielectric layer and the second capacitor dielectric layer are made of a dielectric material having a dielectric constant greater than 7.

14. The capacitor device according to claim 11, wherein the first lower electrodes, the first upper electrode, the second lower electrodes and the second upper electrode are all made of a conductive material;

wherein the conductive material is selected from one or more of titanium, titanium nitride and tungsten.

15. The capacitor device according to claim 11, wherein a height of the top of the second upper electrode relative to the bottoms of the first lower electrodes is 1000 to 1500 nm.

16. A memory, comprising:

the capacitor device according to claim 11;

a transistor formed on a surface of the substrate; and a capacitor contact structure, one end of the capacitor contact structure being connected with the transistor and the bottoms of the first lower electrodes being connected with the other end of the capacitor contact structure.

17. The memory according to claim 16, wherein the second lower electrodes have a width greater than the first lower electrodes.

18. The memory according to claim 16, wherein both the first capacitor dielectric layer and the second capacitor dielectric layer are made of a dielectric material having a dielectric constant greater than 7.

\* \* \* \* \*